US006570991B1

(12) United States Patent
Scheirer et al.
(10) Patent No.: US 6,570,991 B1
(45) Date of Patent: May 27, 2003

(54) MULTI-FEATURE SPEECH/MUSIC DISCRIMINATION SYSTEM

(75) Inventors: Eric D. Scheirer, Somerville, MA (US); Malcolm Slaney, Los Altos Hills, CA (US)

(73) Assignee: Interval Research Corporation, Palo Alto, CA (US)

( * ) Notice: Subject to any disclaimer, the term of this patent is extended or adjusted under 35 U.S.C. 154(b) by 0 days.

(21) Appl. No.: 08/769,056

(22) Filed: Dec. 18, 1996

(51) Int. Cl.[7] ............................ H03G 3/20; H04R 3/00

(52) U.S. Cl. ........................ 381/110; 704/231; 704/233

(58) Field of Search .................. 381/56, 110; 704/231, 704/233, 236, 243, 246

(56) References Cited

U.S. PATENT DOCUMENTS

| | | | |
|---|---|---|---|
| 2,761,897 | A | 9/1956 | Jones |
| 4,441,203 | A | 4/1984 | Fleming |
| 4,542,525 | A | 9/1985 | Hopf |
| 5,375,188 | A | 12/1994 | Serikawa et al. |

FOREIGN PATENT DOCUMENTS

| | | | |
|---|---|---|---|
| EP | 0337868 | A2 | 10/1989 |
| EP | 0637011 | A1 | 2/1995 |
| JP | 06004088 | | 1/1994 |

OTHER PUBLICATIONS

Casale, S. et al, "*A DSP Implemented Speech/Voiceband Data Discriminator*", 1988 IEEE, pps 1419–1427.

Hoyt, John D., "*Detection of Human Speech Using Hybrid Recognition Models*", 1994 IEEE, pps. 330–333.

Okamura, S. et al, "*An Experimental Study of Energy Dips for Speech and Music*", 1023 Pattern Recognition vol. 16 (1983), No. 2, Elmsford, New York, USA, pps. 163–166.

Scheirer, Eric et al, "*Construction and Evaluation of a Robust Multifeature Speech/Music Discriminator*", IEEE, pps. 1331–1334.

Duda, Richard O. et al, "*The Normal Density*", Pattern Classification and Scene Analysis, Stanford Research Institute, pps. 22–25.

Hunt, M.J., "*Experiments in Syllable–Based Recognition of Continuous Speech*", 1980 IEEE, pps. 880–883.

Omohundro, Stephen M., "*Geometric Learning Algorithms*", International Computer Science Institute, Oct. 30, 1989, pps. 1–18.

Saunders, John, "*Real–Time Discrimination of Broadcast Speech/Music*", 1996 IEEE, pps. 993–996.

*Primary Examiner*—Minsun Oh Harvey
(74) *Attorney, Agent, or Firm*—Van Pelt & Yi LLP

(57) ABSTRACT

A speech/music discriminator employs data from multiple features of an audio signal as input to a classifier. Some of the feature data is determined from individual frames of the audio signal, and other input data is based upon variations of a feature over several frames, to distinguish the changes in voiced and unvoiced components of speech from the more constant characteristics of music. Several different types of classifiers for labeling test points on the basis of the feature data are disclosed. A preferred set of classifiers is based upon variations of a nearest-neighbor approach, including a K-d tree spatial partitioning technique.

25 Claims, 9 Drawing Sheets

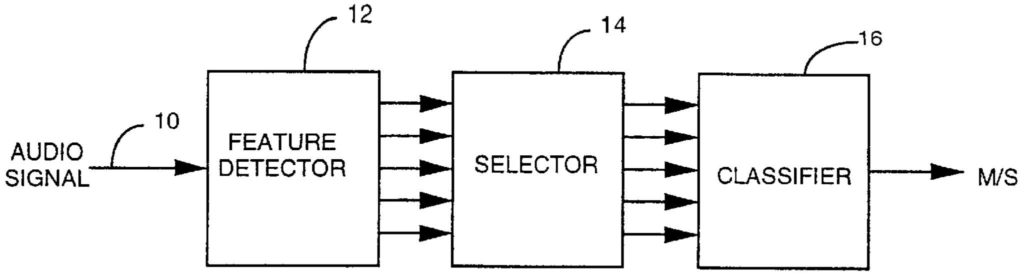
*Fig.1*
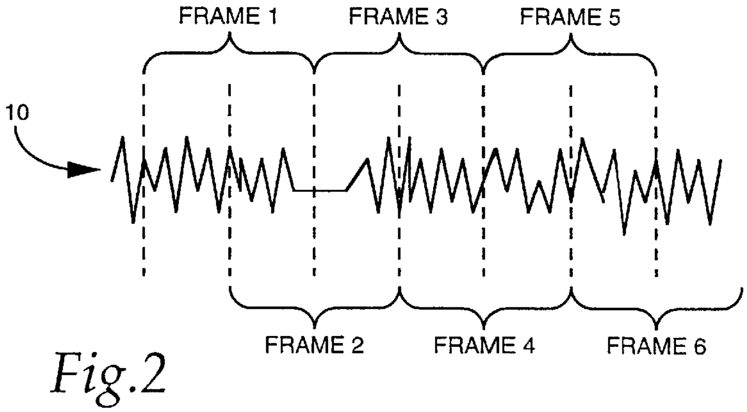
*Fig.2*
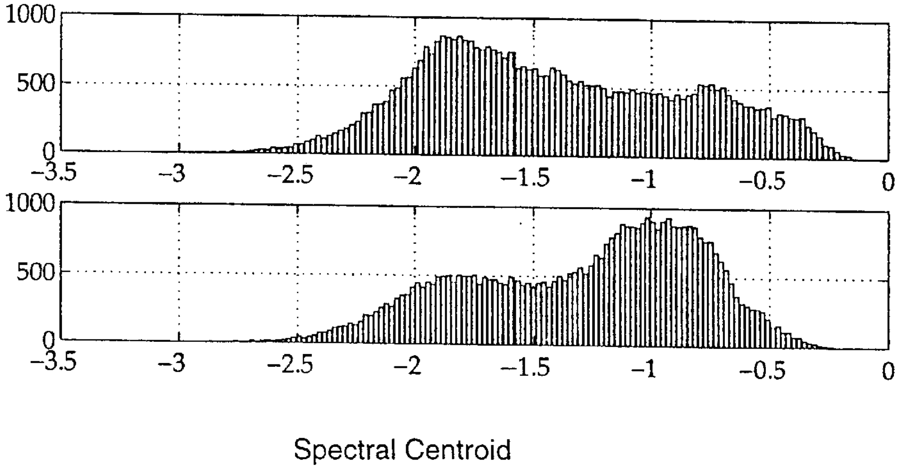
*Fig.3a*
*Fig.3b*

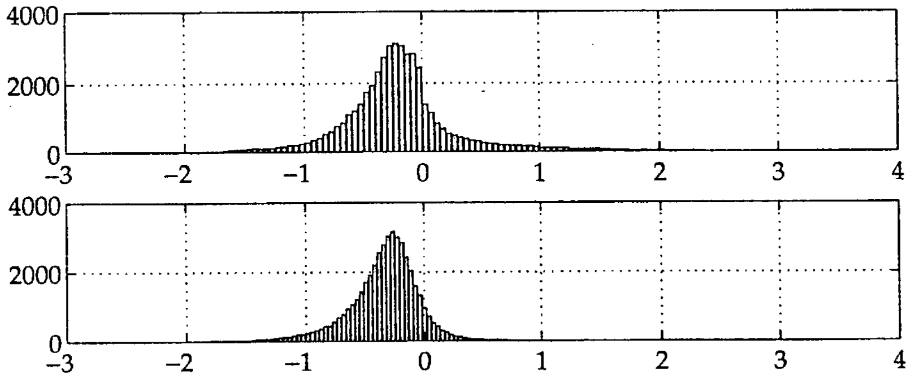
Fig. 4a
Fig. 4b
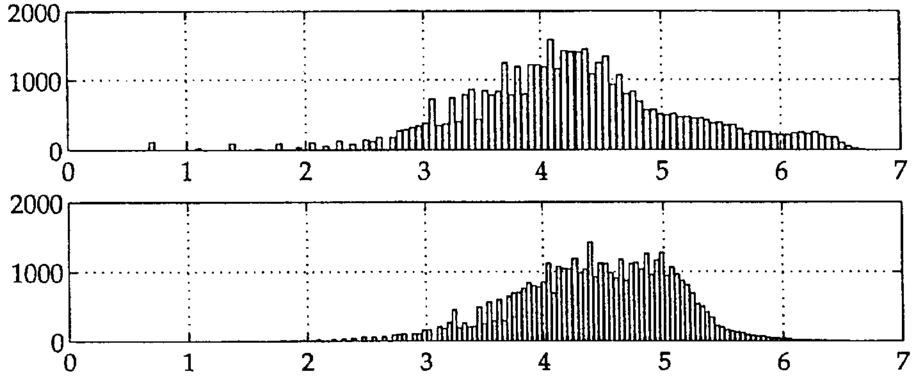
Fig. 5a
Fig. 5b

Spectral rolloff

Cepstrum Resynthesis Residual Magnitude

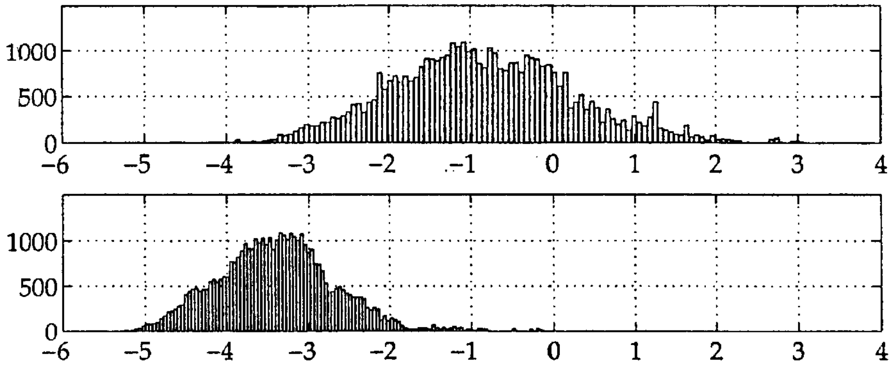
Fig. 9a
Fig. 9b
Variance of Spectral Flux
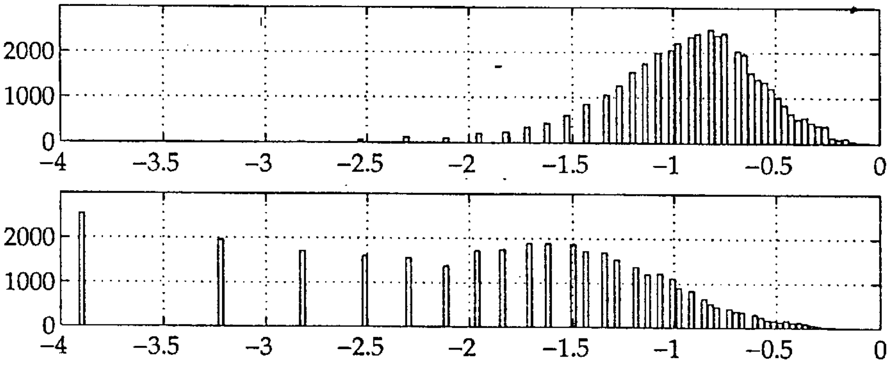
Fig. 10a
Fig. 10b
Low-Energy Frames 4 Hz Modulation Energy Pulse Metric

MULTI-FEATURE SPEECH/MUSIC DISCRIMINATION SYSTEM

FIELD OF THE INVENTION

The present invention is directed to the analysis of audio signals, and more particularly to a system for discriminating between different types of audio signals on the basis of whether their content is primarily speech or music.

BACKGROUND OF THE INVENTION

There are a variety of situations in which, upon receiving an audio input signal, it is desirable to label the corresponding sound as either speech or music. For example, some signal compression techniques are more suitable for speech signals, whereas other compression techniques may be more appropriate for music. By automatically determining whether an incoming audio signal contains speech or music information, the appropriate compression technique can be applied. Another potential application for such discrimination relates to automatic speech recognition that is performed on a multi-media sound object, such as a film soundtrack. As a preprocessing step in such an application, the segments of sound which contain speech must first be identified, so that irrelevant segments can be filtered out before the speech recognition techniques are employed. In yet another application, it may be desirable to construct radio receivers that are capable of making decisions about the content of input signals from various radio stations, to automatically switch to a station having desired content and/or mute undesired content.

Depending upon the particular application, the design criteria for an acceptable speech/music discriminator may vary. For example, in a multi-media processing system, the sound analysis can be carried out in a non-real-time manner. Consequently, the processing speeds can be relatively slow. In contrast, for a radio receiver application, real-time analysis is highly desirable, and therefore the discriminator must have low operating latency. In addition, to provide a low-cost product that is accepted by consumers, the memory requirements for the discrimination process should be relatively small. Preferably, therefore, a speech/music discriminator having utility in a variety of different applications should meet the following criteria:

Robustness—the discriminator should be able to distinguish speech from music throughout a broad signal domain. Human listeners are readily able to distinguish speech from music without regard to the language, speaker, gender or rate of speech, and independently of the type of music. An acceptable speech/music discriminator should also be able to reliably perform under these varying conditions.

Low latency—the discriminator should be able to label a new audio signal as being either speech or music as quickly as possible, as well as to recognize changes from speech to music, or vice versa, as quickly as possible, to provide utility in situations requiring real-time analysis.

Low memory requirements—to minimize the cost of devices incorporating the discriminator, the amount of information that is required to be stored at any given time should be as low as possible.

High accuracy—to be truly useful, the discriminator should operate with relatively low error rates.

In the analysis of audio signals to distinguish speech from music, there are two major factors to be considered, namely the types of inherent information in the signal that can be analyzed for speech or music characteristics, and the classification technique that is used to discriminate between speech and music based upon such information. Early generation discriminators utilized only one particular item of information, or feature, of a sound signal to distinguish music from speech. For example, U.S. Pat. No. 2,761,897 discloses a system in which rapid drops in the level of an audio signal are measured. If the number of changes per unit time is sufficiently high, the sound is labeled as speech. In this type of system, the classification technique is based upon simple thresholding, i.e., whether the number of rapid changes per unit time is above or below a threshold value. Other examples of speech/music discriminating devices which analyze a single feature of an audio signal are disclosed in U.S. Pat. Nos. 4,441,203; 4,542,525 and 5,375,188.

More recently, speech/music discrimination techniques have been developed in which more than one feature of an audio signal is analyzed to distinguish between different types of sounds. For example, one such discrimination technique is disclosed in Saunders, "Real-time Discrimination Of Broadcast Speech/Music," *Proceedings of IEEE ICASSP*, 1996, pages 993–996. In this technique, statistical features which are based upon the zero-crossing rate of an audio signal are computed, and form one set of inputs to a classifier. As a second type of input, energy-based features are utilized. The classifier in this case is a multi-variate Gaussian classifier which separates the feature space into two domains, respectively corresponding to speech and music.

As illustrated by the Saunders article, the accuracy with which an audio signal can be classified as containing either speech or music can be significantly increased by considering multiple features of a sound signal. It is one object of the present invention to provide a speech-music discriminator in which the analysis of an audio signal to classify its sound content is based upon an optimum combination of features for a given environment.

Depending upon the number and type of features that are considered in the analysis of the audio signal, different classification frameworks may exhibit different degrees of accuracy. The primary objective of a multi-variate classifier, which receives multiple type of inputs, is to account for variances between classes of input that can be explained in terms of interactions between the measured features. In essence, every classifier determines a "decision boundary" in the applicable feature space. A maximum a posteriori Gaussian classifier, such as that described in the Saunders article, defines a quadric surface, such as a hyperplane, hypersphere, hyperellipsoid, hyperparaboloid, or the like, between the classes. All data points on one side of this boundary are classified as speech, and all points on the other are considered to be music. This type of classifier may work well in those situations where the data can be readily divided into two distinct clusters, which can be separated by such a simple decision boundary. However, there may be situations in which the dispersion of the data for the different classes is somewhat homogenous within the feature space. In such a case, the Gaussian decision boundary is not as reliable. Accordingly, it is another object of the present invention to provide a speech/music discriminator having a classifier that permits arbitrarily complex decision boundaries to be employed, and thereby increase the accuracy of the discrimination.

SUMMARY OF THE INVENTION

In accordance with one aspect of the present invention, a set of features is provided which can be selectively employed to distinguish speech content from music in an audio signal. In particular, eight different features of a digital audio signal can be measured to analyze the signal. In addition, higher level information is obtained by calculating the variance of some of these features within a predefined time window. More particularly, certain features differ in value between voiced and unvoiced speech. If both types of speech are captured within the time window, the variance will be relatively high. In contrast, music is likely to be constant within the time window, and therefore will have a lower variance value. The differences in the variance values can therefore be employed to distinguish speech sounds from music. By combining data from some of the base features with data from other features, such as the variance features, significant increases in the discrimination accuracy are obtained.

In another aspect of the invention, a "nearest-neighbor" type of classifier is used to distinguish speech data samples from music data samples. Unlike the Gaussian classifier, the nearest-neighbor classifier estimates local probability densities within every area of the feature space. As a result, arbitrarily complex decision boundaries can be generated. In different embodiments of the invention, different types of nearest-neighbor classifiers are employed. In the simplest approach, the nearest data point in the feature space to a sample data point is identified, and the sample is labeled as being of the same class as the identified nearest neighbor. In a second embodiment, a number of data points within the feature space that are nearest to the sample data point are determined, and the new sample point is classified by a voting technique among the nearest points in the feature space. In a preferred embodiment of the invention, the number of nearest data points in the feature space that are employed for such a decision is small, but greater than unity.

In a third embodiment, a K-d tree spatial partitioning technique is employed. In this embodiment, a K-d tree is constructed by recursively partitioning the feature space, beginning with the dimension along which features vary the most. With this approach, the decision boundary between classes can become arbitrarily complex, in dependence upon the size of the set of features that are used to provide input data. Once the feature space is divided into sufficiently small regions, a voting technique is employed among the data points within the region, to assign it to a particular class. Thereafter, when a new sample data point is generated, it is labeled according to the region within which it falls in the feature space.

The foregoing principles of the invention, as well as the advantages offered thereby, are explained in greater detail hereinafter with reference to various examples illustrated in the accompanying drawings.

BRIEF DESCRIPTION OF THE DRAWINGS:

FIG. 1 is a general block diagram of a speech/music discriminator embodying the present invention;

FIG. 2 is an illustration of an audio signal that has been divided into frames;

FIGS. 3*a* and 3*b* are histograms of the spectral centroid for speech and music signals, respectively;

FIGS. 4*a* and 4*b* are histograms of the spectral flux for speech and music signals, respectively;

FIGS. 5*a* and 5*b* are histograms of the zero-crossing rate for speech and music signals, respectively;

FIGS. 9*a* and 9*b* are histograms of the variation in spectral flux for speech and music signals, respectively;

FIGS. 10*a* and 10*b* are histograms of the proportion of low energy frames for speech and music signals, respectively;

DETAILED DESCRIPTION

Figure 6A:
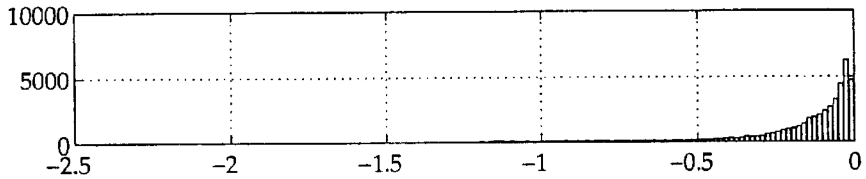
FIGS. 6*a* and 6*b* are histograms of the spectral roll-off for speech and music signals, respectively.

In the following discussion of various embodiments of the invention, it is described in the context of a speech/music discriminator. In other words, all input sounds are considered to fall within one of the two classes of speech or music. In practice, of course, other components can also be present within an audio signal, such as noise, silence or simultaneous speech and music. In some situations where these other types of data are present in the audio signal, it might be more desirable to employ the invention as a speech detector or a music detector. A speech detector can be considered to be different from a speech/music discriminator, in the sense that the output of the detector is not labeled as speech or music. Rather, the audio signal is classified as either "speech" or "non-speech", in which the latter class consists of music, noise, silence and any other audio-related component that is not classified as speech per se. Such a detector may be useful, for example, in an automatic speech recognition context.

The general construction of a speech-music discriminator in accordance with the present invention is illustrated in block diagram form in FIG. 1. An audio signal 10 to be classified is fed to a feature detector 12. If the audio signal is in analog form, for example a radio signal or the output signal from a microphone, it is first converted into a digital format. Within the feature detector, the digital signal is analyzed to measure various quantifiable components that characterize the signal. The individual components, or features, are described in detail hereinafter. Preferably, the audio signal is analyzed on a frame-by-frame basis. Referring to FIG. 2, for example, an audio signal 10 is divided into a plurality of overlapping frames. In the preferred embodiment illustrated therein, each frame has a length of about 40 milliseconds, and adjacent frames overlap one another by one-half of a frame, e.g. 20 milliseconds. Each feature is measured over the duration of each full frame. In addition, for some of the features, the variation of that feature's value over several frames is determined.

After the values for all of the features have been determined for a given frame, or series of frames, they are presented to a selector 14. Depending upon the particular application, certain combinations of features may provide more accurate results than others. In this regard, it is not necessarily the case that the classification accuracy increases with the number of features that are analyzed. Rather, the data that is provided with respect to some features may decrease overall performance, and therefore it is preferable to eliminate the data of those features from the classification process. Furthermore, by reducing the total number of features that are analyzed, the amount of data to be interpreted is reduced, thereby increasing the speed of the classification process. The best set of features to employ is empirically determined for different situations, and is discussed in detail hereinafter.

The data for the appropriately selected features is provided to a classifier 16. Depending upon the number of features that are selected, as well as the particular features themselves, one type of classifier may provide better results than others. For example, a Gaussian classifier, a nearest-neighbor classifier, or a neural network might be used for different sets of features. Conversely, if a particular classifier is preferred, the set of features which function best with that classifier can be selected in the feature selector 14. The classifier 16 evaluates the data from the various features, and provides an output signal which labels each frame of the input audio signal 10 as either speech or music.

For ease of comprehension, the feature detector 12, the selector 14, and the classifier 16 are illustrated in FIG. 1 as separate components. In practice, some or all of these components can be implemented in a computer which is suitably programmed to carry out their functions.

Individual features that can be employed in the classification of an audio signal will now be described in connection with representative pairs of histograms depicted in FIGS. 3–14. These figures pertain to a variety of different types of audio signals that were sampled at a rate of 22,050 samples per second and manually labelled as being speech or music. In the figures, the upper histogram of a pair depicts measured results for a number of samples of speech data, and the lower histogram depicts values for samples of music data. In all of the histograms, a log transformation is employed to provide a monotonic normalization of the values for the features. This normalization is preferred, since it has been found to improve the spread and conformity of the data over the applicable range of values. Thus, the x-axis values can be negative, for features in which the measured result is a fraction less than one, as well as positive. The y-axis represent the number of frames in which a given value was measured for that feature.

The histograms depicted in the figures are representative of the different results between speech and music that might be obtained for the respective features. In practice, actual results may vary, in dependence upon factors such as the size and makeup of the set of known samples that are used to derive training data, preprocessing of the signals that is used to generate spectrograms, and the like.

One of the features, depicted in FIGS. 3*a* and 3*b*, is the spectral centroid, which represents the balancing point of the spectral power distribution within a frame. Many types of music involve percussive sounds which, by including high-frequency noise, result in a higher spectral mean. In addition, excitation energies can be higher for music than for speech, in which pitch stays within a range of fairly low values. As a result, the spectral centroid for music is, on average, higher than that for speech, as depicted in FIG. 3*b*. In addition, the spectral centroid has higher values for unvoiced speech than it does for voiced speech. The spectral centroid for a frame occurring at time t is computed as follows $$SC_t = \frac{\sum_k kX_t[k]}{\sum_k X_t[k]}$$

where k is an index corresponding to a frequency, or small band of frequencies, within the overall measured spectrum, and $X_t[k]$ is the power of the signal at the corresponding frequency band.

Another analysis feature, depicted in FIGS. 4*a* and 4*b*, is known as the spectral flux. This feature measures frame-to-frame spectral difference. Speech has a higher rate of change, and goes through more drastic frame-to-frame changes than music. As a result, the spectral flux value is higher for speech, particularly unvoiced speech, than it is for music. Also, speech alternates periods of transition, such as the boundaries between consonance and vowels, with periods of relative stasis, i.e. vowel sounds, whereas music typically has a more constant rate of change. Consequently, the spectral flux is highest at the transition between voiced and unvoiced sounds.

Another feature which is employed for speech/music discrimination is the zero-crossing rate, depicted in FIGS. 5*a* and 5*b*. This value is a measure of the number of time-domain zero-voltage crossings within a speech frame. In essence, the zero-crossing rate indicates the dominant frequency during the time period of the frame.

Figure 6B:
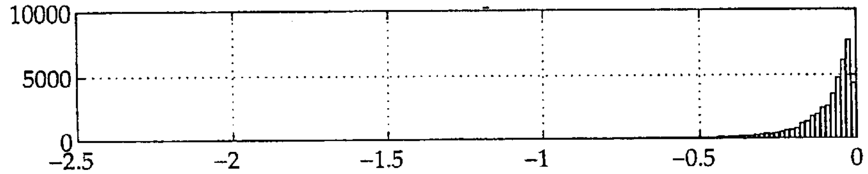

The next feature, depicted in FIGS. 6*a* and 6*b*, is the spectral roll-off point. This value measures the frequency below which 95% of the power in the spectrum resides. Music, due to percussive sounds, attack transients, and the like, has more energy in the high frequency ranges than speech. As a result, the spectral roll-off point exhibits higher values for music and unvoiced speech, and lower values for voiced speech. The spectral roll-off value for a frame is computed as follows:

$SR_t = K$, where $$\sum_{k<K} X_t[k] = 0.95 \sum_k X_t[k]$$

Figure 7A:
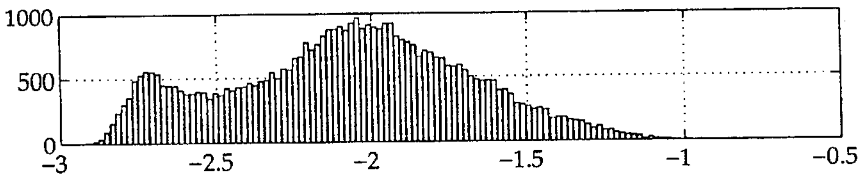
FIGS. 7*a* and 7*b* are histograms of the cepstral resynthesis residual magnitude for speech and music signals, respectively.
Figure 7B:
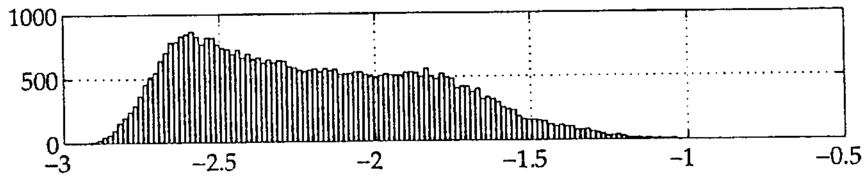
Figure 7C:
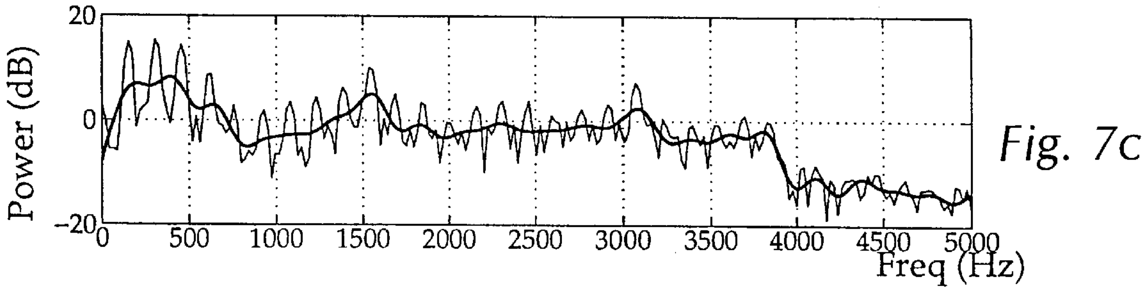
FIG. 7*c* is a graph showing the power spectra for voiced speech and a smoothed version of the speech signal.

The next feature, depicted in FIGS. 7*a* and 7*b*, comprises the cepstrum resynthesis residual magnitude. The value for this feature is determined by first computing the cepstrum of the spectrogram by means of a Discrete Fourier Transform, as described for example in Bogert et al, *The Frequency Analysis of Time Series for Echoes: Cepstrum, Pseudo-autocovariance, Cross-Cepstrum and Saphe Cracking*, John Wiley and Sons, New York 1963, pp 209–243. The result is then smoothed over a time window, and the sound is resynthesized. The smooth spectrum is then compared to the original (unsmoothed) spectrum, to obtain an error value. A better fit between the two spectra is obtained for unvoiced speech than for voiced speech or music, due to the fact that unvoiced speech better fits a homomorphic single-source filter model than does music. In other words, the error value is higher for voiced speech and music. FIG. 7*c* illustrates an example of the difference between the smoothed and unsmoothed spectra for voiced speech. The cepstrum resynthesis residual magnitude is computed as follows:

$$CR_t = \sqrt{\sum_k (X_t[k] - Y_t[k])^2}$$

where $Y_t[k]$ is the resynthesized smoothed spectrum.

Figure 8A:
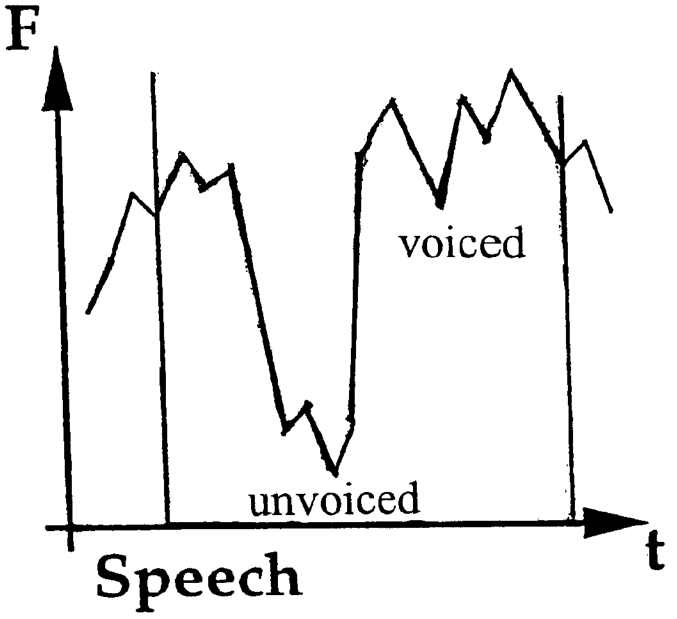
FIGS. 8*a* and 8*b* are graphs depicting variances between speech and music signals, in general.
Figure 8B:
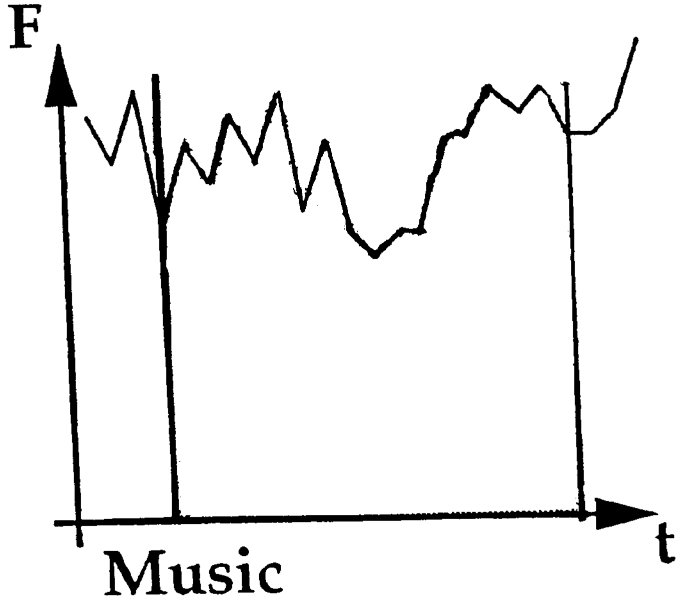

In addition to each of the five features whose histograms are depicted in FIGS. 3–7, it is also desirable to determine the variance of these particular features. The variance is obtained by calculating the amount which a feature varies within a suitable time window, e.g. the difference between maximum and minimum values in the window. In one embodiment of the invention, the time window comprises one second of feature data. Thus, for the example illustrated in FIG. 2, in which overlapping frames of 40 millisecond duration are employed, each one-second window contains 50 data points. Each of the features described above differs in value between voiced and unvoiced speech. By capturing periods of both types of speech within a window, a high variance value will result, as shown in FIG. 8*a*. In contrast, as depicted in FIG. 8*b*, music is likely to be more constant with regard to the individual features during a one-second period, and consequently will have lower variance values. FIGS. 9*a* and 9*b* illustrate the histograms of log-transformed values for the variance of spectral flux. In comparison to the actual spectral flux values, depicted in FIGS. 4*a* and 4*b*, it can be seen that the variance feature provides a much better discriminator between speech and music.

Another feature comprises the proportion of "low-energy" frames. In general, the energy envelope for music is flatter than for speech, due to the fact that speech has alternating periods of energy and silence, whereas music generally has continuous energy. The percentage of low energy frames is measured by calculating the mean RMS power within a window of sound, e.g. one second, and counting the number of individual frames within that window having less than a fraction of the mean power. For example, all frames having a measured power which is less than 50% of the mean power, can be counted as low energy frames. The number of such frames is divided by the total number of frames in the window, to provide the value for this feature. As depicted in FIGS. 10*a* and 10*b*, this feature provides a measure of the skewness of the plower distribution, and has a higher value for speech than for music.

Figure 11:
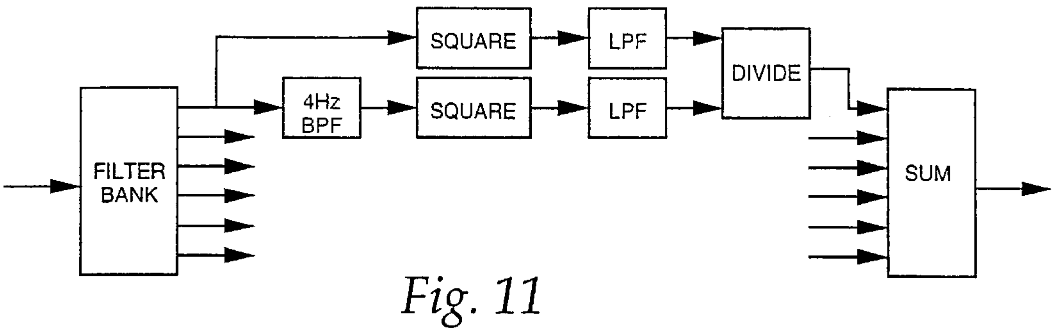
FIG. 11 is a block diagram of a speech modulation detector.
Figure 12A:
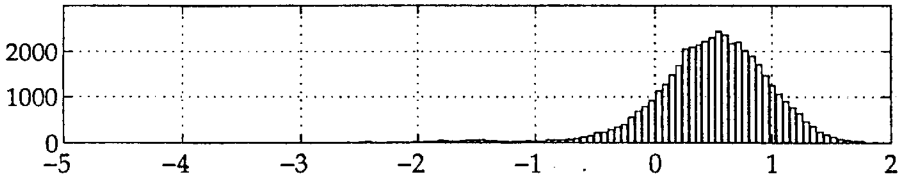
FIGS. 12*a* and 12*b* are histograms of the 4 Hz modulation energy for speech and music signals, respectively.
Figure 12B:
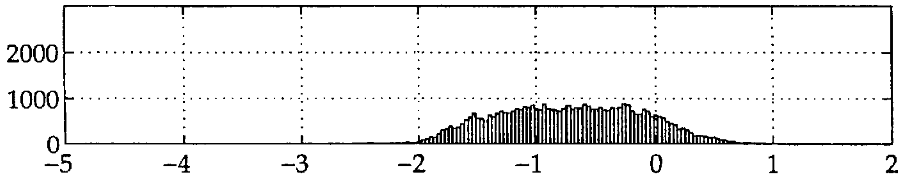

Another feature is based upon the modulation frequencies for typical speech. The syllabic rate of speech generally tends to be centered around four syllables per second. Thus, by measuring the energy in a modulation band centered around this frequency, speech can be more readily detected. One example of a speech modulation detector is illustrated in FIG. 11. Referring thereto, the energy spectrogram of an audio input signal is calculated, and various frequency ranges are combined into channels, in a manner analogous to MFCC analysis. For example, as discussed in Hunt et al, "Experiments in Syllable-Based Recognition of Continuous Speech," ICASSP Proceedings, April 1980, pp. 880–883, the power spectrum can be divided into twenty channels of equal width. Within each channel, the signal is passed through a four Hz bandpass filter, to obtain the components of the signal at the speech modulation rate. The output signal from this filter is squared to obtain energy at that rate. This energy signal and the original spectrogram signal are low-pass filtered, to obtain short term averages. The four Hz modulation energy signal is then divided by the frame energy signal to get a normalized speech modulation energy value. The resulting values for speech and music data are depicted in FIGS. 12*a* and 12*b*.

The last measured feature, known as the pulse metric, indicates whether there is a strong, driving beat in an audio signal, as is characteristic of certain types of music. A strong beat leads to broadband rhythmic modulation in the audio signal as a whole. In other words, regardless of any particular frequency band that is investigated, the same rhythmic regularities appear. Thus, by combining autocorrelations in different bands, the amount of rhythm can be measured.

Figure 13:
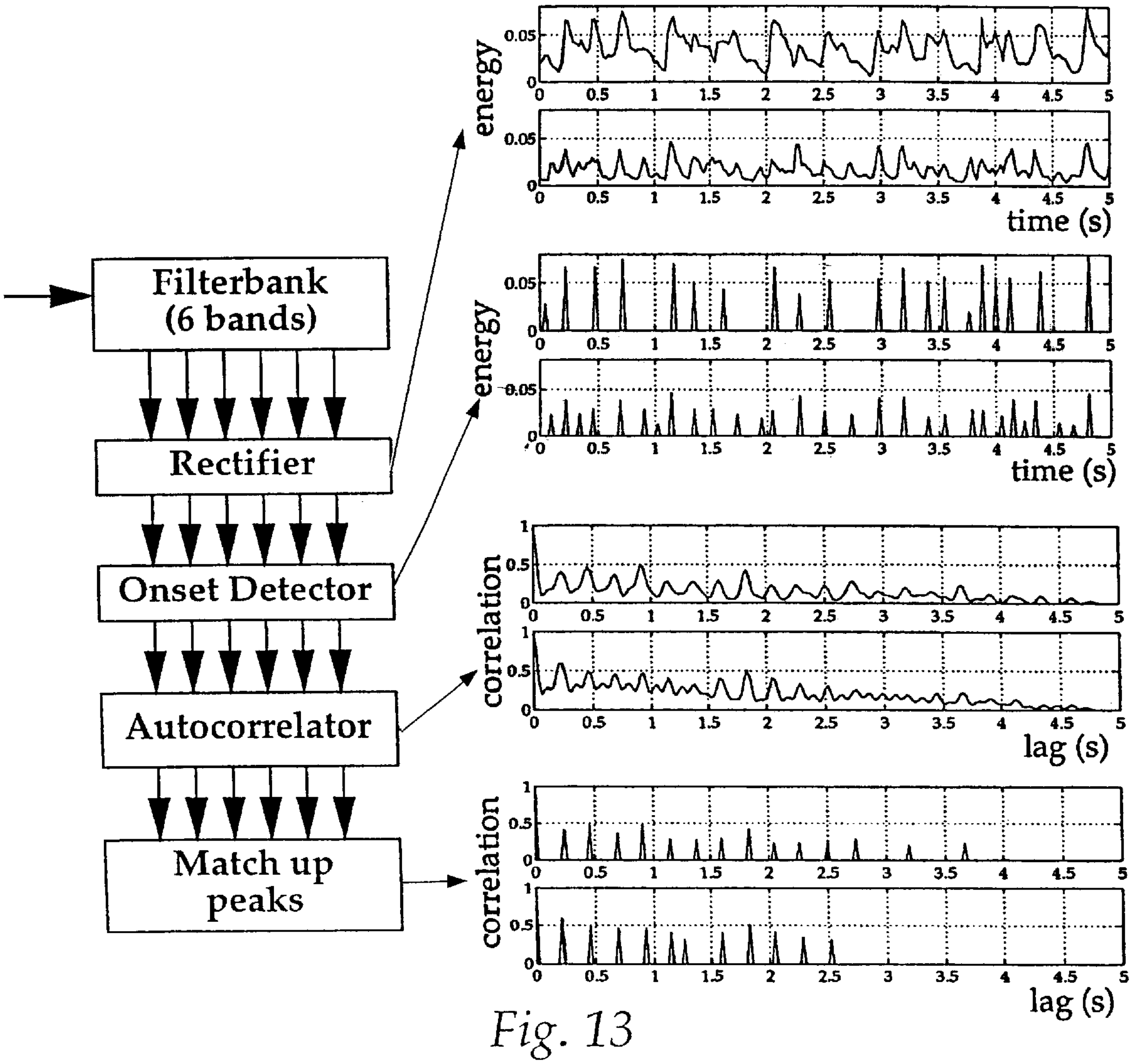
FIG. 13 is a block diagram of a circuit for determining the pulse metric of signals, along with corresponding signal graphs for two bands at each stage of the circuit.
Figure 14A:
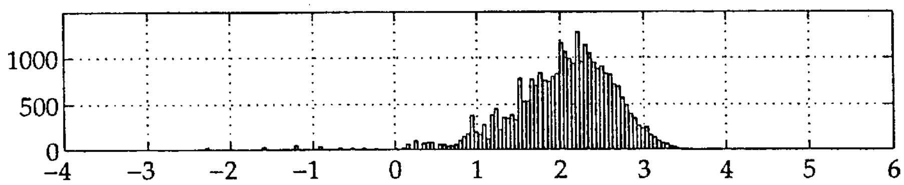
FIGS. 14*a* and 14*b* are histograms of the pulse metric for speech and music signals, respectively.
Figure 14B:
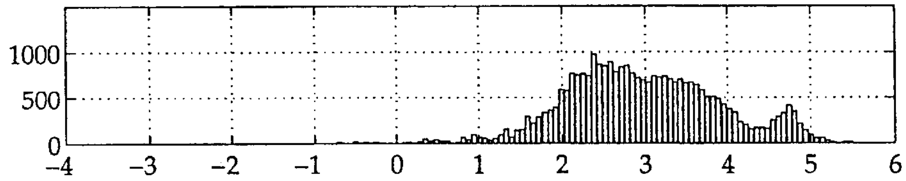

Referring to FIG. 13, a pulse detector is illustrated, along with the output signals for two bands at each stage of the detector. An audio input signal is provided to a filter bank, which divides it into six frequency bands in the illustrated embodiment. Each band is rectified, to determine the total power, or energy envelope, and passed through a peak detector, which approximates a pulse train of onset positions. The pulse trains then go through autocorrelation, which provides an indication of the modulation frequencies of the power in the signal. If desired, the peaks can be smoothed prior to the autocorrelation step. The frequency bands are paired, and the peaks in the modulation frequency track are lined up, to provide an indication of all of the frequencies at which there is a strong rhythmic content. A count is made of the number of frequency peaks which are the same in both bands. This calculation is made for each of the fifteen possible pairs of bands, and the final sum is taken as the pulse metric. The relative pulse metric values for speech data and music data are illustrated in the histograms of FIGS. 14*a* and 14*b*.

Figure 15:
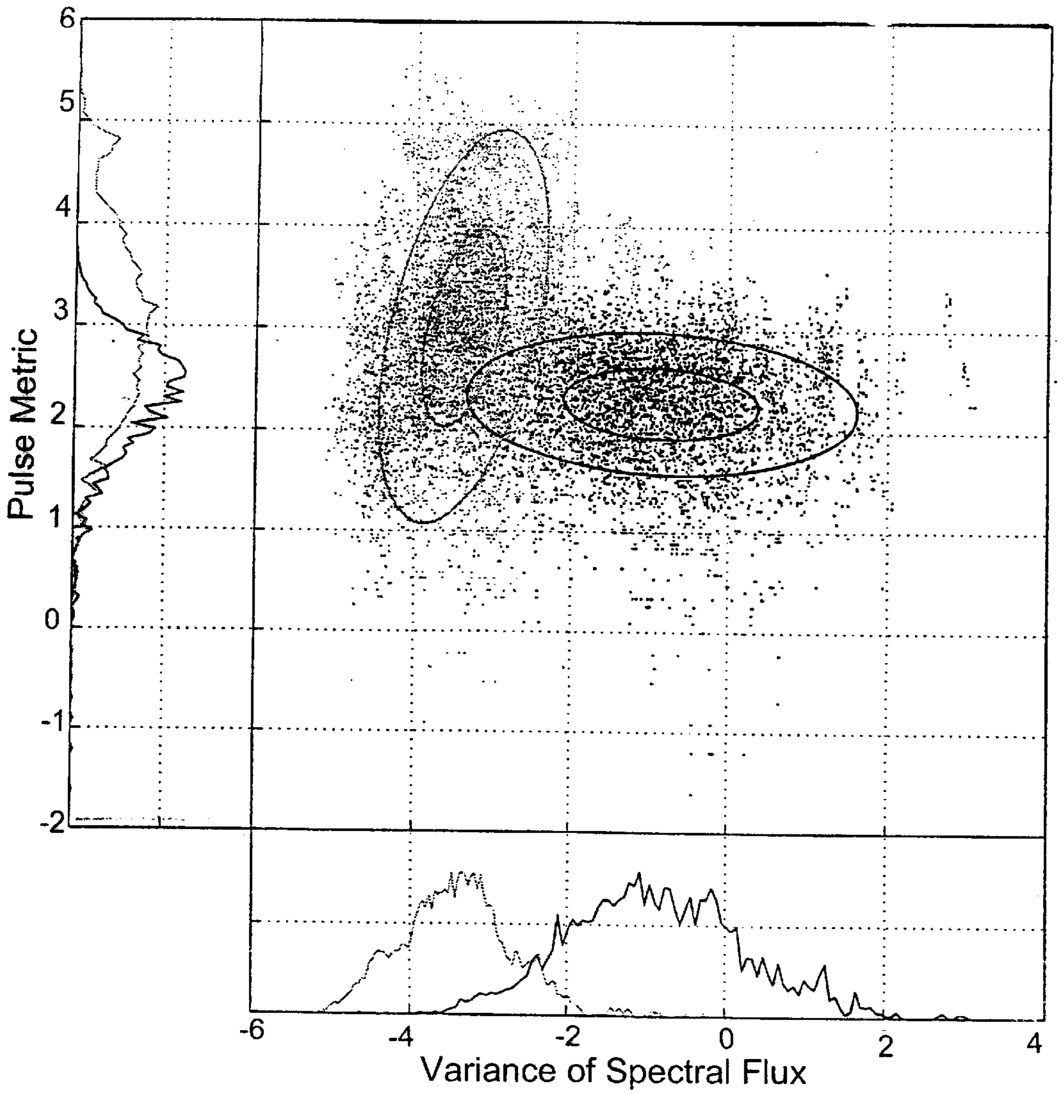
FIG. 15 is a graph illustrating the probability distributions of two measured features.

By analyzing the information provided by the foregoing features, or some subset thereof, a discriminator can be constructed which distinguishes between speech data and music data in an audio input signal. FIG. 15 depicts log transformed data values for two individual features, namely spectral flux variance and pulse metric, as well as their distribution in a two-dimensional feature space. The speech data is depicted by heavier histogram lines and data points, and the music data is represented by lighter lines and data points. As can be seen from the figure, there is significant overlap of the histogram data when the features are viewed individually, but much better discrimination between data points when they are considered together, as illustrated by the ellipses which indicate the mean and variance of each set of data.

Figure 16:
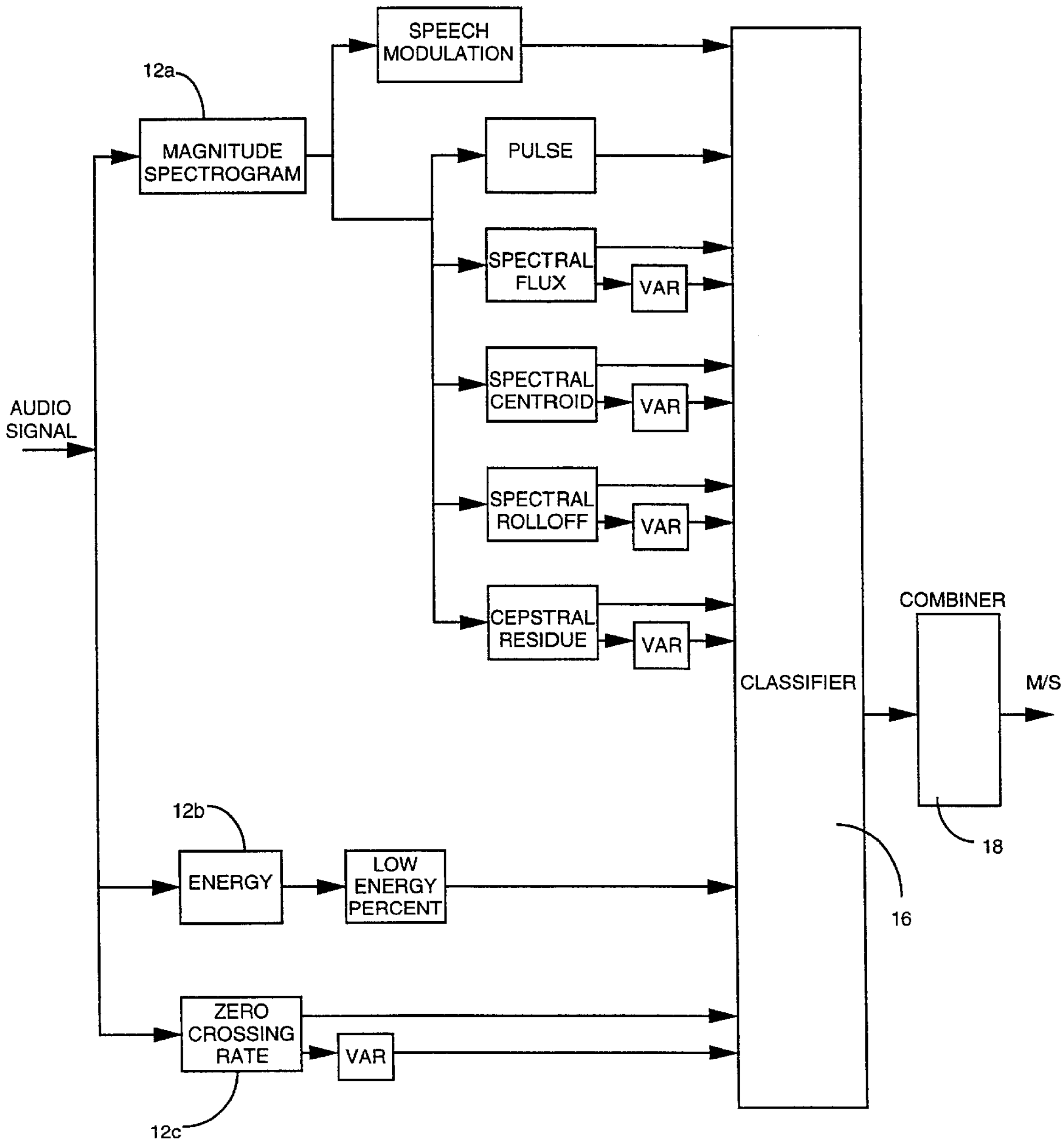
FIG. 16 is a more detailed block diagram of a discriminator.

FIG. 16 is a more detailed block diagram of a discriminator which is based upon the features described above. A sampled input audio signal is first processed to obtain its spectrogram, energy content and zero-crossing rate in corresponding signal processing modules 12*a*, 12*b* an 12*c*. The values for each of these features is stored in a cache memory associated with the respective modules. Depending upon available memory, the data for a number of consecutive frames might be stored in each cache memory. For example, a cache memory might store the measured values for the most recent 150 frames of the input signal. From the data stored in these cache memories, additional feature values for the audio signal, as well as their variances, are calculated and stored in corresponding cache memories.

In a preferred embodiment of the invention, each measured feature is stored as a separate data structure. The elements of a data structure might include the name of the source data from which the feature is calculated, the sample rate, the size of the measured data value (e.g. number of bytes stored per sample), a pointer to the cache memory location, and the length of an input window, for example.

A multivariate classifier 16 is employed to account for variances between classes that can be defined with respect to interrelationships between different features. Different types of classifiers can be employed to label input signals corresponding to the various features. In general, a classifier is based upon a model which is constructed from a set of known data samples, e.g. training samples. The training samples define points in a feature space that are labeled according to their class. Depending upon the type of classifier, a decision boundary is formed within the feature space, to distinguish the different classes of data. Thereafter, the locations for unknown input data samples are determined within the feature space, and these locations determine the label to be applied to the data samples.

One type of classifier is based upon a maximum a posteriori Gaussian framework. In this type of classifier, each of the training classes, namely speech data and music data, is modeled with a single full covariance Gaussian model. Once the models have been constructed, new data points are classified by comparing the location of the point in feature space to the locations of the class centers for the models. Any suitable distance metric within the feature space can be employed, such as the Mahalanobis distance. This type of Gaussian classifier utilizes a quadric surface as the boundary between classes. All points on one side of this boundary are classified as speech, and all points on the other side are labeled as music.

Another type of classifier is based upon a Gaussian mixture model. In this approach, each class is modeled as a weighted mixture of diagonal-covariance Gaussians. Every data point in the feature space has an associated likelihood that it belongs to a particular Gaussian mixture. To classify an unknown data point, the likelihoods of the different classes are compared to one another. The decision boundary that is formed in the Gaussian mixture model is best described as a union of quadrics. For every Gaussian in the model, another boundary is employed to partition the feature space. Each of these boundaries is oriented orthogonally to the feature axes, since the covariance of each class is forced to be diagonal. For further information pertaining to Gaussian classifiers, reference is made to Duda and Hart, *Pattern Recognition and Scene Analysis*, John Wiley and Sons, 1973.

Another type of classifier, and one which is preferred in the context of the present invention, is based upon a nearest-neighbor approach. In a nearest-neighbor classifier, all of the points of a training set are placed in a feature space having a dimension for each feature that is employed. In essence, each data point defines a vector in the feature space. To classify a new point, the local neighborhood of the feature space is examined, to identify the nearest training points. In a "strict" nearest neighbor approach, the test point is assigned the same class as the closest training point to it in the feature space. In a variation of this approach, a number of the nearest neighbor points are identified, and the classifier conducts a class vote among these nearest neighbors. For example, if the five nearest neighbors of the test point are selected, the test point is labeled with the same class as that to which at least three of these nearest neighbor points belong. In a preferred implementation of this embodiment, the number of nearest neighbors which are considered is small, but greater than unity, for example three or five nearest data points. The nearest neighbor approach creates an arbitrarily complex linear decision boundary between the classes. The complexity of the boundary increases as more training data is employed to define points within the feature space.

Another variant of the nearest neighbor approach is based upon spatial partitioning techniques. One common type of spatial partitioning approach is based upon the K-d tree algorithm. For a detailed discussion of this algorithm, reference is made to Omohundro, "Geometric Learning Algorithms" Technical Report 89-041, International Computer Science Institute, Berkeley, Calif, Oct. 30, 1989 (URL: gopher://smorgasbord.ICSI.Berkeley.EDU:70/11/usr/local/ftp/techreports/1989/tr-89-041.ps.Z), the disclosure of which is incorporated herein by reference. In general, a K-d tree is constructed by recursively partitioning the feature space into rectangular, or hyperrectangular, regions. The dimension along which the features vary the most is first selected, and the training data is split on the basis of that dimension. This process is repeated, one dimension at a time, until the number of training points in a local region of the feature space is small. At that point, a vote is taken among the training points in the region, to assign it to a class. Thereafter, when a new test point is to be labeled, a determination is made as to which region of the feature space it lies within. The test point is then labeled with the class assigned to that region. The decision boundaries that are formed by the K-d tree are known as "Manhattan surfaces", namely a union of hyperplanes that are oriented orthogonally to the feature axes.

As noted previously, the accuracy of the discriminator does not necessarily increase with the addition of more features as inputs to the classifier. Rather, performance can be enhanced by selecting a subset of the full feature set. Table 1 illustrates the mean and standard-deviation error (expressed as a percentage) that were obtained by utilizing different subsets of features as inputs to a k-d spatial classifier.

| Classifier Subset | Speech Error | Music Error | Total Error |
|---|---|---|---|
| All features | 5.8 ± 2.1 | 7.8 ± 6.4 | 6.8 ± 3.5 |
| Best 8 | 6.2 ± 2.2 | 7.3 ± 6.1 | 6.7 ± 3.3 |
| Best 3 | 6.7 ± 1.9 | 4.9 ± 3.7 | 5.8 ± 2.1 |
| Best 1 | 12 ± 2.2 | 15 ± 6.4 | 13 ± 3.5 |

As can be seen, the use of only a single feature adversely affects classification performance, even when the feature exhibiting the best results, in this case the variation of spectral flux, is employed. In contrast, results are improved when certain combinations of features are employed. In the example of Table 1, the "Best 3" subset is comprised of the variance of spectral flux, proportion of low-energy frames, and pulse metric. The "Best 8" subset contains all of the features which look at more than one frame of data, namely the 4 Hz modulation, percentage of lower energy frames, variation in spectral roll-off, variation in spectral centroid, variation in spectral flux, variation in zero-crossing rate, variation in cepstral residual error, and pulse metric. As can be seen, there is relatively little advantage, if any, by using more than three features, particularly for the detection of music. Furthermore, the smaller number of features permits the classification to be carried out faster.

It is useful to note that the performance results depicted in Table 1 are based on frame-by-frame error. However, audio signals rarely, if ever, switch between speech and music on a frame-by-frame basis. Rather speech and music are more likely to persist over longer periods of time, e.g. seconds or minutes, depending on the context. Thus, where it is known a priori that the speech and music content exist for longer stretches of an audio signal, this information can be employed to increase the performance accuracy of the classifier.

Figure 17:
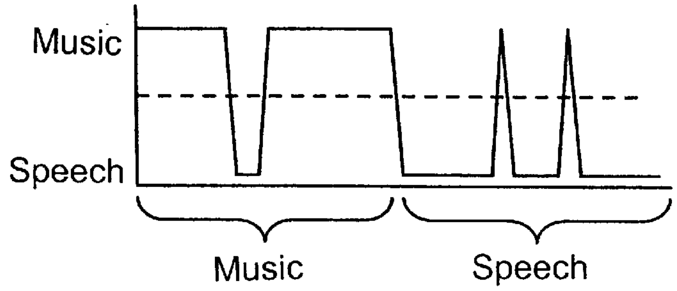
FIG. 17 is a graph illustrating an example of speech/music decisions for a sequence of frames.

For instance, a sliding window can be employed to evaluate individual speech/music decisions over a number of frames to produce a final result. FIG. 17 illustrates an example of speech/music decisions that might be made for a series of successive frames by the classifier 16. As can be seen, for the first half of the signal, most of the frames are classified as music, but a small number are labelled as speech within this segment. Similarly, the latter half of the signal contains primarily speech frames, with a few exceptions. In the context of a radio broadcast, it can be safely assumed that the shortest segments of speech and music will each have a duration of at least 5 seconds. Thus, if "speech" decision endures for only a few frames of the audio signal, that decision can be ignored and the signal labelled as music, as in the first half of the signal in FIG. 17.

In practice, the decision for individual frames that are made by the classifier 16 can be provided to a combiner, or windowing unit, 18 for a final decision. In the combiner, a number of successive decisions are evaluated, and the final output signal is switched from speech to music, and vice versa, only if a given decision persists over a majority of a certain number of the most recent frames. In one embodiment of the invention utilizing a window of 2.4 seconds, the total error rate dropped to 1.4%. The actual number of frames that are examined will be determined by consideration of latency and performance. Longer latency provides better performance, but may be undesirable where real-time response is required. The most appropriate size for the window will therefore vary with the intended application for the discriminator.

It will be appreciated by those of ordinary skill in the art that the present invention can be embodied in other specific forms without departing from the spirit or essential characteristics thereof. The presently disclosed embodiments are considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. A method for discriminating between speech and music content in an audio signal, comprising the steps of:

- selecting a set of audio signal samples;
- measuring values for a plurality of features in each sample of said set of samples;
- defining a multi-dimensional feature space containing data points which respectively correspond to the measured feature values for each sample, and labelling each data point as relating to speech or music;
- measuring feature values for a test sample of an audio signal and determining a corresponding data point in said feature space;
- determining the label for at least one data point in said feature space which is close to the data point corresponding to said test sample; and
- classifying the test sample in accordance with the determined label.

2. The method of claim 1 wherein said determining step comprises determining the label for the data point in said feature space which is nearest to the data point for said test sample.

3. The method of claim 1 wherein said determining step comprises the steps of identifying a plurality of data points which are nearest to the data point for said test sample, and selecting the label which is associated with a majority of the identified data points.

4. The method of claim 1 wherein said determining step comprises the steps of dividing the feature space into regions in accordance with said features, labelling each region as relating to speech data or music data in accordance with the labels for the data points in the region, and determining the region in said feature space in which the data point for said test sample is located.

5. The method of claim 1 wherein one of said features is the variation of spectral flux among a series of frames of the audio signal.

6. The method of claim 1 wherein one of said features is a pulse metric which identifies correspondence of modulation frequency peaks in different respective frequency bands of the audio signal.

7. The method of claim 1 wherein one of said features is measured by the steps of determining the mean power for a series of frames of said audio signal, and determining the proportion of frames in said series whose power is less than a predetermined fraction of said mean power.

8. The method of claim 1 wherein one of said features is the proportion of energy in the audio signal having speech modulation frequencies.

9. The method of claim 8 wherein said speech modulation frequencies are around 4 Hz.

10. The method of claim 1 wherein said audio signal is divided into a sequence of frames, and wherein values for some of said features are measured for individual frames, and values for others of said features relate to variations of measured values over a series of frames.

11. The method of claim 1 wherein said audio signal is divided into a sequence of frames and further including the steps of classifying each frame of the test sample as relating to speech or music, examining the classifications for a plurality of successive frames, and determining a final classification on the basis of the examined classifications.

12. A method for determining whether an audio signal contains music content, comprising the steps of:

- dividing the audio signal into a plurality of frequency bands;
- determining modulation frequencies of the audio signal in each band;
- identifying the amount of correspondence of the modulation frequencies among the frequency bands; and
- classifying whether audio signal has musical content in dependence upon the identified amount of correspondence;
- wherein the step of determining the modulation frequencies in a frequency band comprises the steps of:
  - determining an energy envelope of the frequency band;
  - identifying peaks in the energy envelope; and
  - calculating a windowed autocorrelation of the peaks.

13. A method for determining whether an audio signal contains music content, comprising the steps of:

- dividing the audio signal into a plurality of frequency bands;
- determining modulation frequencies of the audio signal in each band;
- identifying the amount of correspondence of the modulation frequencies among the frequency bands; and
- classifying whether audio signal has musical content in dependence upon the identified amount of correspondence;
- wherein the step of identifying the amount of correspondence of the modulation frequencies comprises the steps of:
  - determining peaks in the modulation frequencies for each band;

selecting a first pair of frequency bands;

counting the number of modulation frequency peaks which are common to both bands in the selected pair; and repeating said counting step for all possible pairs of frequency bands.

14. A method for discriminating between speech and music content in audio signals that are divided into successive frames, comprising the steps of:

selecting a set of audio signal samples;

measuring values of a feature for individual frames in said samples;

determining the variance of the measured feature values over a series of frames in said samples;

defining a multi-dimensional feature space having at least one dimension which pertains to the variance of feature values;

defining a decision boundary between speech and music in said feature space;

measuring a feature value for a test sample of an audio signal and a variance of a feature value, and determining a corresponding data point in said feature space; and classifying the test sample in accordance with the location of said corresponding point relative to said decision boundary.

15. The method of claim 14 wherein said classifying step comprises determining whether a data point in said feature space which is nearest to the data point for said test sample pertains to speech or music.

16. The method of claim 14 wherein said classifying step comprises the steps of identifying a plurality of data points which are nearest to the data point for said test sample, and labelling said test sample as speech or music in accordance with whether a majority of the identified data points pertain to speech or music.

17. The method of claim 14 wherein said decision defining step comprises the steps of dividing the feature space into regions in accordance with measured features and variances, and labelling each region as relating to speech data or music data, and said classifying step includes determining the region in said feature space in which the data point for said test sample is located.

18. A method for detecting speech content in an audio signal, comprising the steps of:

selecting a set of audio signal samples;

measuring values for a plurality of features in samples of said set of samples;

defining a multi-dimensional feature space containing data points which respectively correspond to the measured feature values for each sample, and labelling whether each data point relates to speech;

measuring feature values for a test sample of an audio signal and determining a corresponding data point in said feature space;

determining the label for at least one data point in said feature space which is close to the data point corresponding to said test sample; and indicating whether the test sample is speech in accordance with the determined label.

19. The method of claim 18 wherein said determining step comprises determining the label for the data point in said feature space which is nearest to the data point for said test sample.

20. The method of claim 18 wherein said determining step comprises the steps of identifying a plurality of data points which are nearest to the data point for said test sample, and selecting the label which is associated with a majority of the identified data points.

21. The method of claim 18 wherein said determining step comprises the steps of dividing the feature space into rectangular regions in accordance with said features, labelling whether each region relates to speech data in accordance with the labels for the data points in the region, and determining the region in said feature space in which the data point for said test sample is located.

22. A method for detecting music content in an audio signal, comprising the steps of:

selecting a set of audio signal samples;

measuring values for a plurality of features in samples of said set of samples;

defining a multi-dimensional feature space containing data points which respectively correspond to the measured feature values for each sample, and labelling whether each data point relates to music;

measuring feature values for a test sample of an audio signal and determining a corresponding data point in said feature space;

determining the label for at least one data point in said feature space which is close to the data point corresponding to said test sample; and indicating whether the test sample is music in accordance with the determined label.

23. The method of claim 22 wherein said determining step comprises determining the label for the data point in said feature space which is nearest to the data point for said test sample.

24. The method of claim 22 wherein said determining step comprises the steps of identifying a plurality of data points which are nearest to the data point for said test sample, and selecting the label which is associated with a majority of the identified data points.

25. The method of claim 22 wherein said determining step comprises the steps of dividing the feature spaced into rectangular regions in accordance with said features, labelling whether each region relates to music data in accordance with the labels for the data points in the region, and determining the region in said feature space in which the data point for said test sample is located.

* * * * *